United States Patent
Wu et al.

(10) Patent No.: US 9,316,207 B2
(45) Date of Patent: Apr. 19, 2016

(54) FAULT DETECTION DEVICE FOR WIND POWER GENERATOR AND MEANS OF JUDGMENT THEREOF

(75) Inventors: Shan-Jung Wu, Taoyuan County (TW); Wei-Nian Su, Taoyuan County (TW)

(73) Assignee: INSTITUTE OF NUCLEAR ENERGY RESEARCH, Jiaan Village, Longtan, Taoyuan (TW)

( * ) Notice: Subject to any disclaimer, the term of this patent is extended or adjusted under 35 U.S.C. 154(b) by 814 days.

(21) Appl. No.: 13/280,365

(22) Filed: Oct. 25, 2011

(65) Prior Publication Data

US 2013/0103327 A1    Apr. 25, 2013

(51) Int. Cl.
*F03D 11/00* (2006.01)
*G01R 31/34* (2006.01)

(52) U.S. Cl.
CPC ......... *F03D 11/0091* (2013.01); *F05B 2270/32* (2013.01); *F05B 2270/321* (2013.01); *G01R 31/343* (2013.01); *Y02E 10/722* (2013.01)

(58) Field of Classification Search
CPC ....... F03D 7/00; F03D 9/002; F03D 11/0091; F05B 2270/32; F05B 2270/321; G01R 31/343; Y02E 10/722
See application file for complete search history.

(56) References Cited

U.S. PATENT DOCUMENTS

| | | | |
|---|---|---|---|
| 2011/0270577 A1* | 11/2011 | Mihok et al. | 702/188 |
| 2013/0010505 A1* | 1/2013 | Bo et al. | 363/37 |

* cited by examiner

*Primary Examiner* — Mischita Henson
*Assistant Examiner* — Kyle R Quigley

(57) ABSTRACT

A fault detection device and its means of judgment for wind power generator, which mainly has a first detection device installed at the joint between the vane of wind power generator and the connection part of the pivot, meanwhile, the first detection device is to detect a vane pitch angle ($\beta m$). In addition, the pivot is installed with a second detection device for detection of a measured rotational speed of vane ($\Omega rotor$-m), meanwhile, on the generator of the wind power generator, it is installed with a third detection device so as to detect a measured power value (Pm) and measured three phase mean voltage value (Vac-m), in addition, on the wind direction and wind speed transmitter, it is installed with a fourth detection device so as to detect a measured wind speed value (Um).

2 Claims, 10 Drawing Sheets

FAULT DETECTION DEVICE FOR WIND POWER GENERATOR AND MEANS OF JUDGMENT THEREOF

BACKGROUND OF THE INVENTION

1. Field of the Invention

This invention relates to a fault detection device and its means of judgment of a wind power generator, and it specifically relates to a device and its means of judgment that can use several detection data to make general judgment so as to generate the most correct and objective fault detection result.

2. Description of the Prior Art

Wind power generation is to use natural phenomenon to generate electrical power, which meets the green energy trend, hence, it is a newly emergent industry that is under wide development, however, along with the increase of power generation amount and the power generation stability requirement, the structure of wind power generator has become more and more complicated, and its fault detection as well as judgment has become more and more difficult.

Although there is basic detection device or sensor on each wind power generator so as to seize securely the working status of each device, yet as affected by different environmental condition, fault or damage could be generated on each detection device; aiming at such situation, it is common practice for more advanced wind power generator to be installed with spare detection device so as to avoid the entire work abnormality caused by the damage of some of the devices, however, there is usually not enough room in the machine cabinet.

Currently, it is usually used in the monitoring system of wind power generator, and single detection signal obtained from different detection device is analyzed and processed with respective and independent program, meanwhile, between the monitoring systems, there is no action and function for the mutual comparison of signal correctness, hence, specific device could easily get malfunctioned and the actual time situation becomes difficult to be seized.

SUMMARY OF THE INVENTION

The main objective of this invention is to provide a fault detection device for a wind power generator. Usually, on the wind power generator, it can be installed with several sets of detection devices so as to provide all kinds of detection information for the correct judgment of the faulted part.

Another objective of this invention is to provide means for the judgment of the fault of wind power generator. It can integrate effectively several sets of detection data and sum them up for judgment and for generating the most correct and objective fault detection result.

Yet another objective of this invention is to provide a fault detection device for wind power generator. It can effectively reduce the cost of the protection equipment of wind power generator, and it can avoid the entire error judgment caused by the fault of single detection device.

To achieve the above objective and effectiveness, technical means taken by this invention includes: a fault detection device for wind power generator, which is mainly used in a wind power generator, and the wind power generator has vane that can be driven by wind force, meanwhile, the vane is connected to a pivot, and the pivot will drive a power generator to generate power through a variable speed gear box. Moreover, wind power generator can be connected additionally to a wind direction and wind speed transmitter, and the wind direction and wind speed transmitter has wind speed vane that can be driven by wind force; it has the following features: the wind power generator further includes: a first detection device, which is installed at the connection part between the vane and pivot so as to detect measured vane pitch angle value of the vane ($\beta_m$); a second detection device, which is installed at the pivot so as to detect the measured vane rotational speed of the pivot ($\Omega_{rotor-m}$); a third detection device, which is installed on the power generator so as to detect the measured power value of the power generator ($P_m$) and the measured three phase mean voltage value ($V_{ac-m}$); a fourth detection device, which is installed at central part of the wind speed vane so as to detect the measured wind speed value ($U_m$).

The above and other objects, features and advantages of the present invention will become apparent from the following detailed description taken with the accompanying drawings.

DETAILED DESCRIPTION OF THE INVENTION

Figure 1:
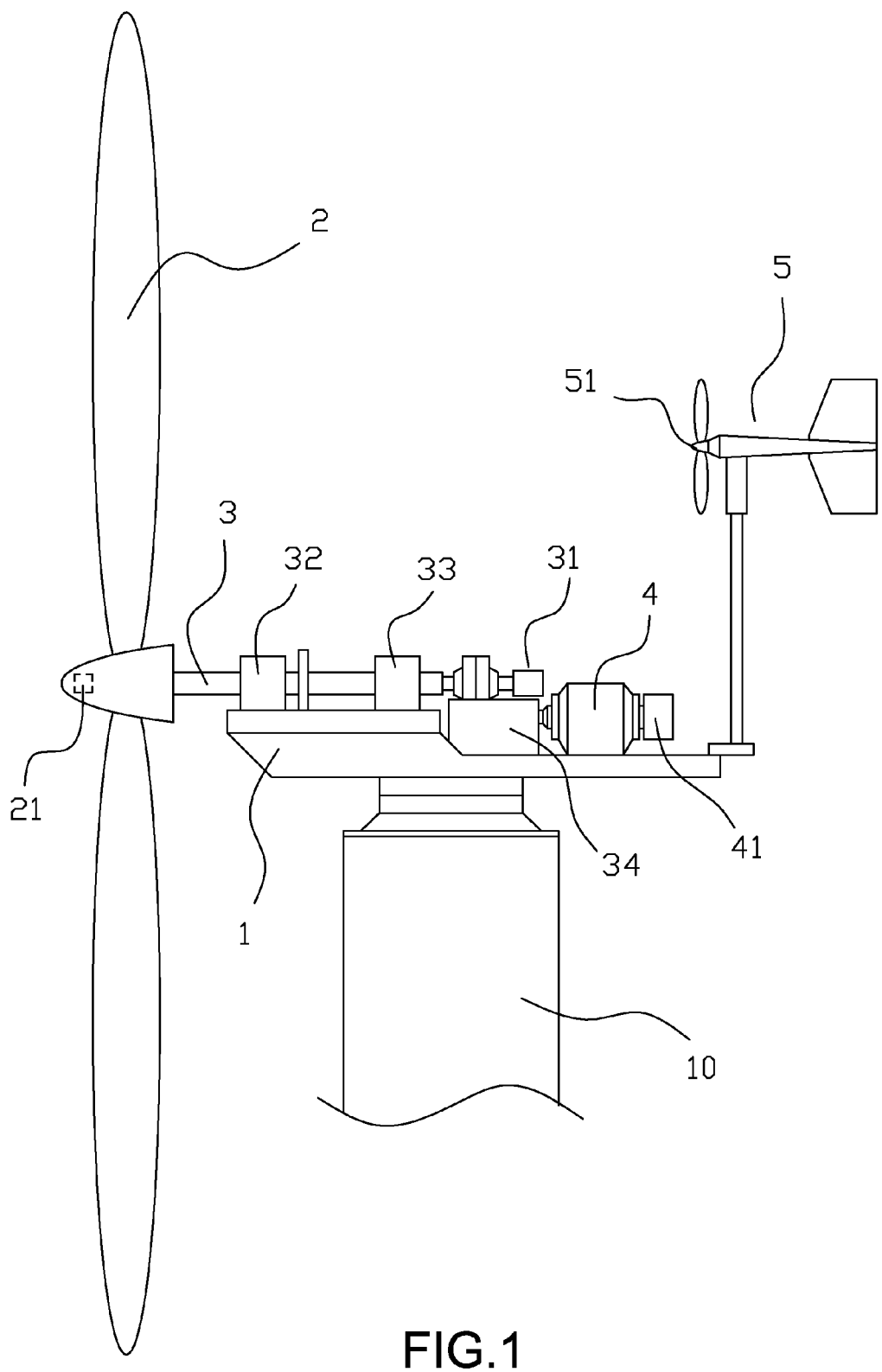
FIG. 1 illustrates the basic structure of this invention.
Figure 2:
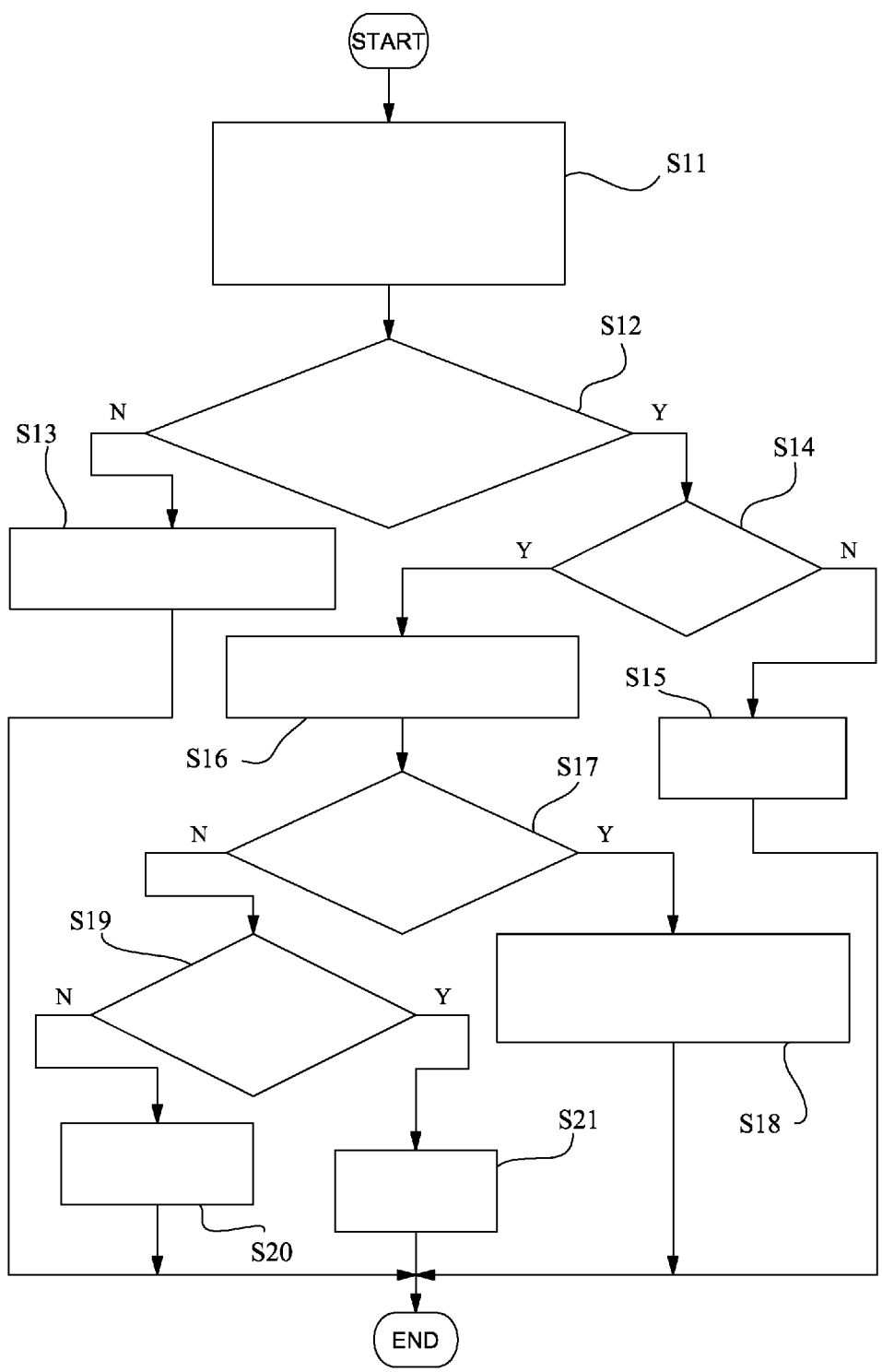
FIG. 2 illustrates the flow chart of the means of judgment of this invention.

Please refer to FIG. 1, it can be obviously considered that this invention is mainly applicable to horizontal axis actively controlled wind power generator system, wherein the wind power generator contains a base 1 installed on a pre-installed rack 10, meanwhile, on the base 1, through a plural of bearings 32 and 33, it can be pivoted to a pivot 3, and one end of the pivot 3 is installed with vane 2, in the mean time, the vane 2 contains active vane pitch control system, which uses hydraulic motor to drive the umbrella shape gear, which in turn drives the pitch angle of the vane to rotate simultaneously, then pitch angle of each vane, through a first detection device 21 (which can be an encoder) that is connected to the motor, will be sensed and sent back, moreover, due to the hardware limitation of the motor, the pitch angle of each vane can only rotate between 0° (pitch up) to 80° (pitch down), hence, when the pitch of each vane is rotated to the upper limit (80°), since the gear gap will cause the error of 1° to 2°, at this moment, reasonable pitch angle display of each vane should be in the range of 78°~80°, and one end of the pivot 3 is installed with a third detection device 31, so as to sense and send out the measured vane rotational value ($\Omega_{rotor-m}$) of the pivot 3, meanwhile, the pivot 3 can, through a variable speed gear box 34 to drive a power generator 4 to generate power, moreover, at the output end of the power generator 4, it is installed with a third detection device 41 for detecting and sending out measure power value ($P_m$) and measured three phase mean voltage value ($V_{ac-m}$) of the power generator 4; furthermore, on the base 1, it can be additionally associated with a wind direction and wind speed transmitter 5, and the wind speed transmitter 5 has wind speed vane 51 that can be driven by wind force, and at the center part of the wind speed vane 51, it is installed with a fourth detection device 51 for detecting and sending out the measured wind speed value ($U_m$).

Please refer to FIGS. 2 to 10, the process flow of the means of judgment of this invention mainly comprises of the following step:

S 11 step "Enter measured vane rotational speed value ($\Omega_{rotor-m}$), measured three phase mean voltage value ($V_{ac-m}$), measured power value ($P_m$), measured vane pitch angle value ($\beta_m$) and measured wind speed value ($U_m$)" from the above mentioned first, second, third and fourth detection devices 21, 31, 41 and 51 that are installed on wind power generator, respectively, then through S 12 judgment step "if the measured vane rotational speed value ($\Omega_{rotor-m}$) is equal to the actual vane rotational speed value ($\Omega_{rotor}$); if the measured three phase mean voltage value ($V_{ac-m}$) equal to the actual three phase mean voltage value ($V_{ac}$)". Then use the following equation $$V_{ac} = 6.0913 \, \Omega_{rotor}$$

Figure 3:
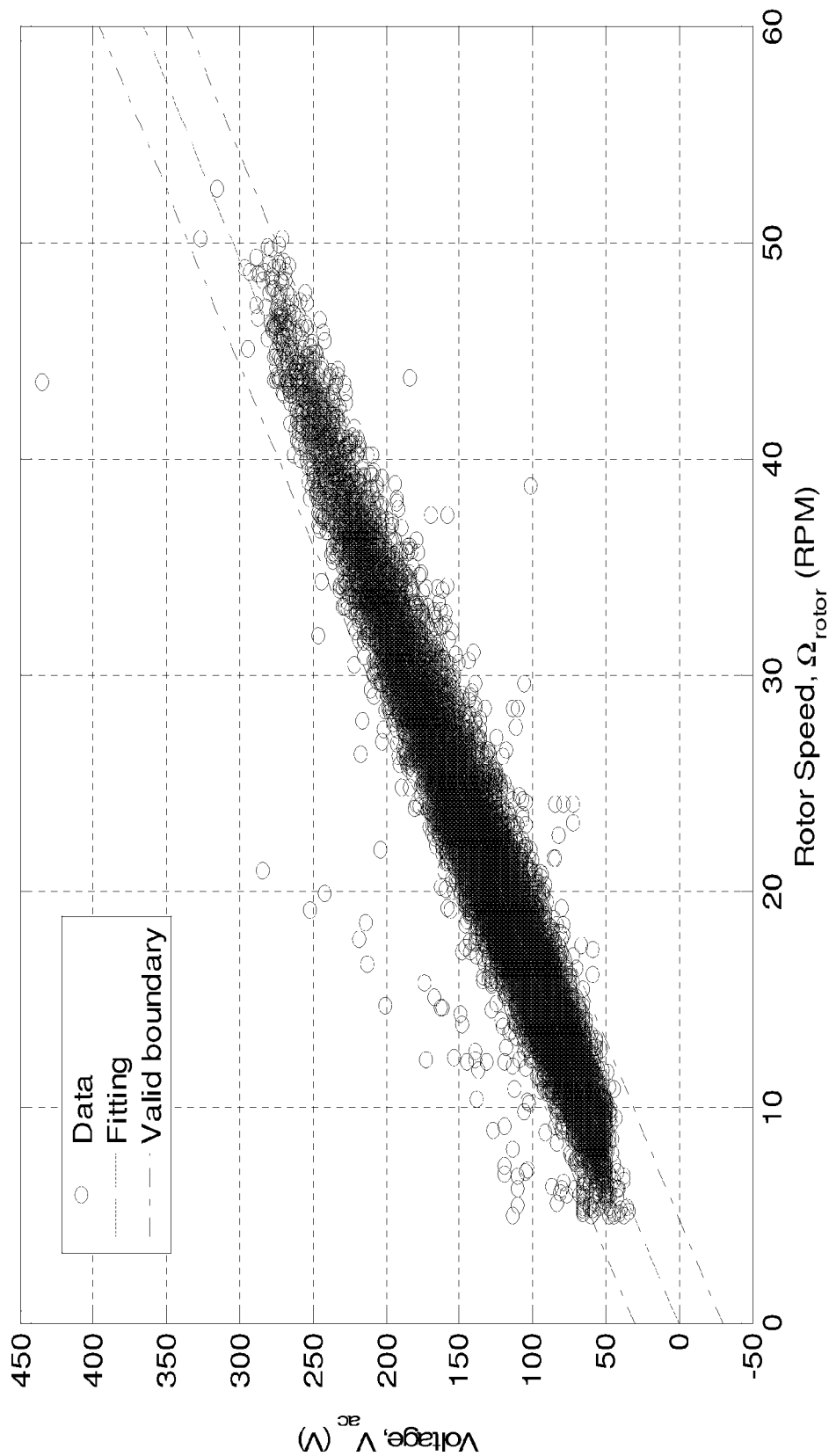
FIG. 3 illustrates the relation between voltage and rotational speed of this invention.

Then the calculated three phase mean voltage value (Vac-c) as in the dotted line of FIG. 3 can be obtained, and the following equation can be used for the judgment.

$$|V_{ac-m} - V_{ac-c}| \leq 30 (\text{volt})$$

Considering transient effect and uncertainty factor, if the error value between the measured three phase mean voltage value ($V_{ac-m}$) and the calculated three phase mean voltage value ($V_{ac-c}$) is less than 30 volt (as in the area defined by two center lines in FIG. 4), then the judgment result can be considered as affirmative "Y", at this moment, the measured vane rotational speed value ($\Omega_{rotor-m}$) is equal to actual vane rotational speed value ($\Omega_{rotor}$), and the measured three phase mean voltage value ($V_{ac-m}$) is equal to actual three phase mean voltage value ($V_{ac}$), then S 14 judgment step can be executed again, that is, "if the measured power value ($P_m$) is equal to actual power value (P)"; on the contrary, if the above error is more than 30 volt (the judgment result is negative "N"), then go to S 13 step "Measured vane rotational speed ($\Omega_{rotor-m}$) is doubted; measured three phase mean voltage value ($V_{ac-m}$) is doubted"; since there is no third party for comparison, hence, which one of the measured vane rotational speed ($\Omega_{rotor-m}$) or measured three phase mean voltage value ($V_{ac-m}$) is abnormal is unable to be determined, and the S 14 judgment step "if the measured power value ($P_m$) is equal to actual power value (P)" is to substitute measured voltage mean value ($V_{ac-m}$) into the following equation:

$$P = 0, \, V_{ac} < 31.65$$
$$= 2.74 \times 10^{-7} \, V_{ac}^3 - 8.656 \times 10^{-6} V_{ac}^2, \, 31.65 \leq V_{ac} 284.85$$
$$= 0.6338 \, V_{ac} - 175.2191, \, 284.85 \leq V_{ac} < 316.5$$
$$= 0.0786 \, V_{ac} + 0.8816, \, 316.5 \leq V_{ac} < 440$$

Figure 4:
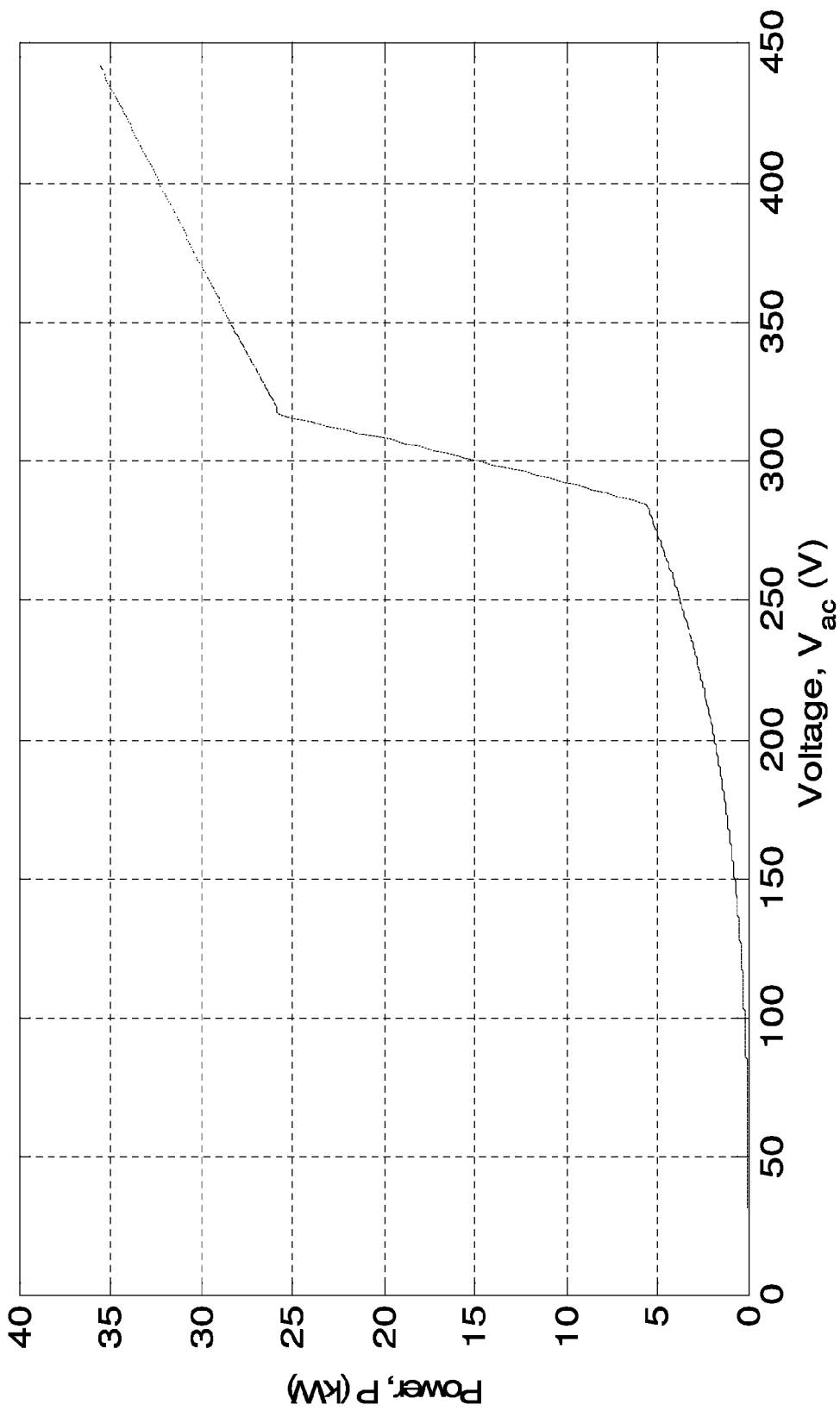
FIG. 4 illustrates the power curve of this invention.

Calculated power value (Pc) as in the curve of FIG. 4 can then be obtained, and through the use of the following equation, $$P_{Relative \, Error} = \frac{|P_m - P_c|}{P_c}$$

relative error power value ($P_{Relative \, Error}$) can be generated, if the relative error power value ($P_{Relative \, Error}$) is more than 5%, it can be considered as negative "N" on the judgment result, then go to S 15 step "Measured power value ($P_m$) error", and if the relative error power value ($P_{Relative \, Error}$) is less than 5%, then the judgment result can be considered as affirmative "Y", then the measured power value ($P_m$) is equal to actual power value (P), at this moment, then through S 16 step "measured vane rotational speed value ($\Omega_{rotor-m}$) is normal; measured three phase mean voltage value ($V_{ac-m}$) is normal", then execute again S 17 judgment step "if actual power coefficient ($C_p$)—actual tip speed ratio ($\lambda$)—actual vane pitch angle value ($\beta$) curve is matched", due to the dynamic characteristic of horizontal axis wind power generation system, its wind speed, rotational speed, power coefficient and pitch angle have the following relative correlation, $$\lambda = \frac{\pi \Omega R}{30 U} \text{ and } C_p = \frac{P}{0.5 \rho U^3 \pi R^2}$$

Figure 5:
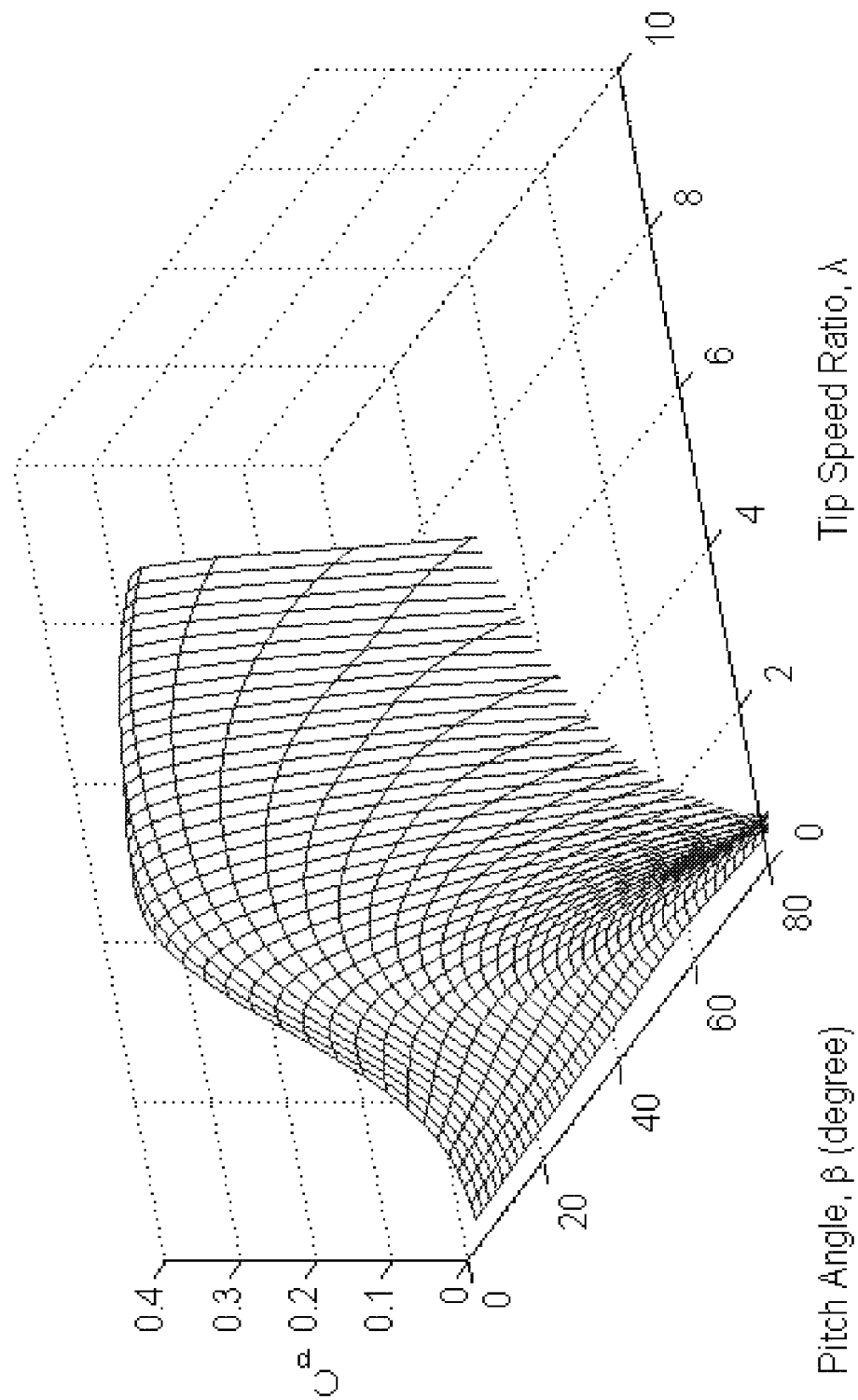
FIG. 5 is the surface chart of actual power coefficient when the deviation angle between the yaw angle and wind direction of this invention is 0.
Figure 6:
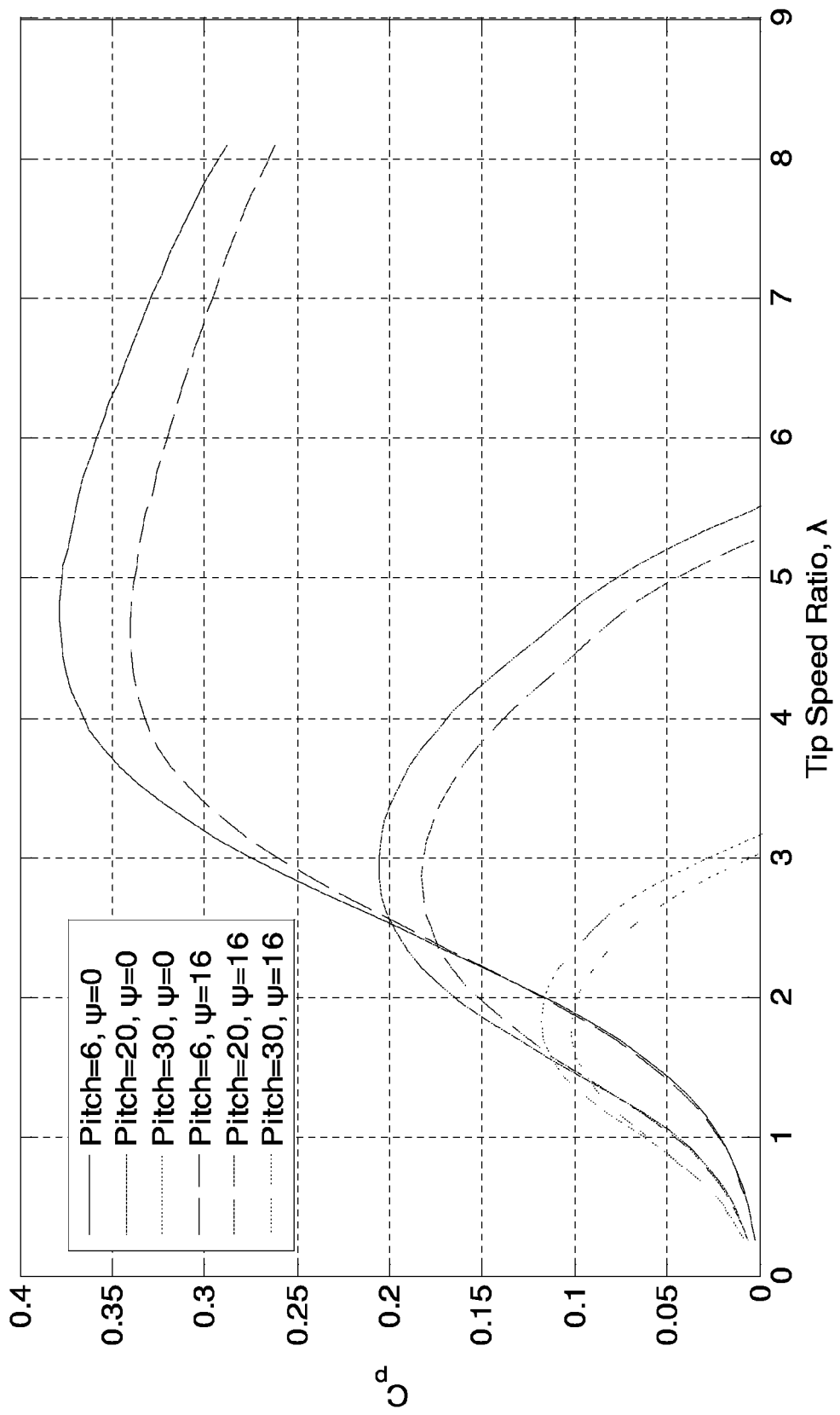
FIG. 6 is the chart of actual tip speed versus actual power coefficient of this invention when the actual vane pitch angle value and the deviation angle between yaw angle and wind direction are fixed.
Figure 7:
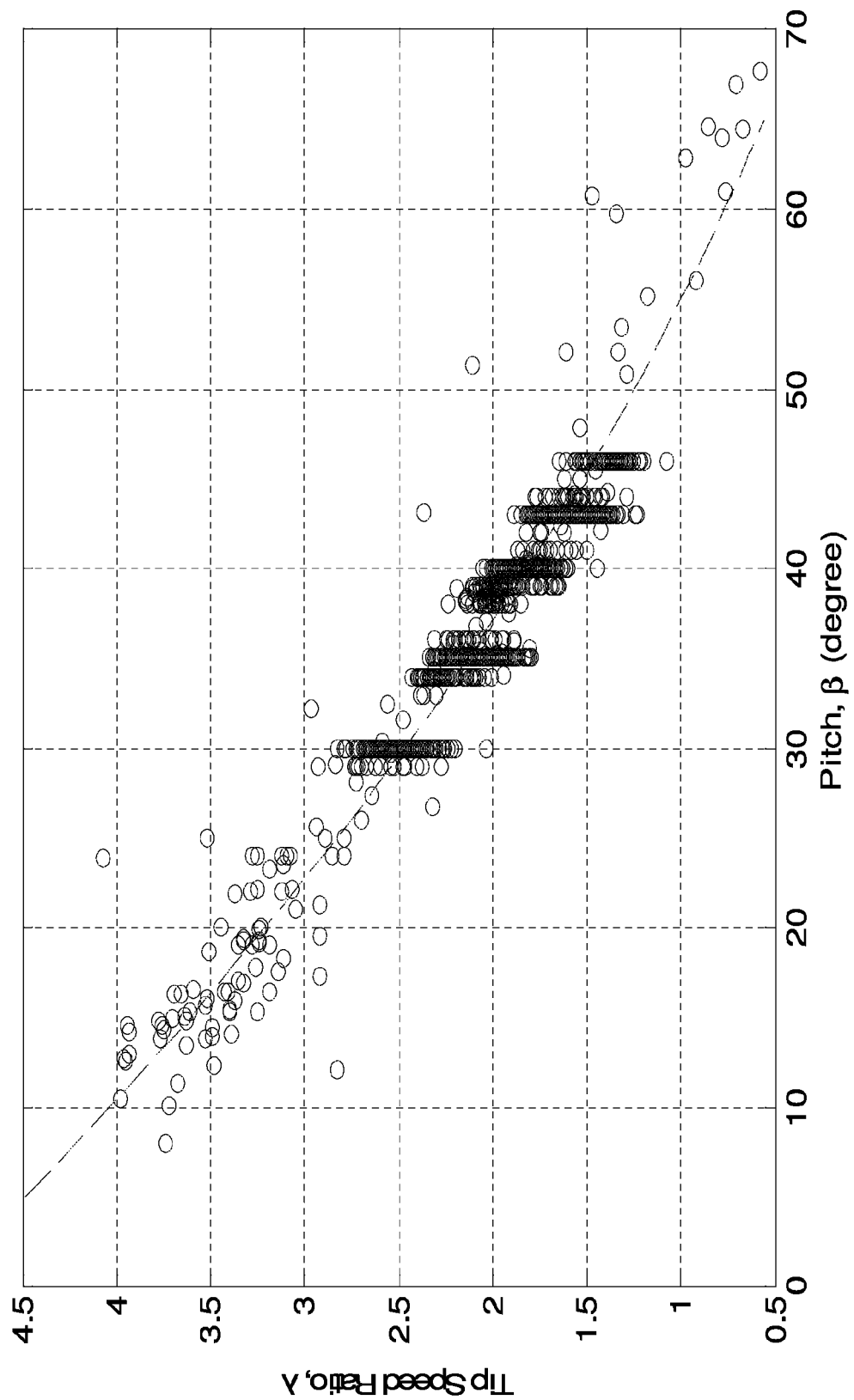
FIG. 7 is the curve of actual tip speed versus actual vane pitch angle value for this invention.

Moreover, output power, in the mean time, is affected by the yaw angle and the deviation angle ($\psi$) among different wind directions, which is as shown in FIG. 5, when $\psi=0$, it is the correlation curve of the actual power coefficient ($C_p$)—actual tip speed ratio ($\lambda$)—actual vane pitch angle value ($\beta$), and the FIG. 6 is, under fixed actual vane pitch angle value ($\beta$) and deviation angle ($\psi$) between yaw angle and wind direction, to simplify three dimensional surface of FIG. 5 into two dimensional curve; from the FIG. 6, it can be considered that when the deviation angle ($\psi$) between the yaw angle and wind direction is within 16°, the error of the actual power coefficient ($C_p$) will be less than 5%, hence, we can neglect the influence from deviation angle. In addition, through experiment, we can get FIGS. 7 and 8, the curve equation in the FIG. 7 corresponds to the following correlation equation between actual tip speed ratio ($\lambda$) and actual vane pitch angle value ($\beta$):

$$\lambda = 0.000435 \beta^2 - 0.09587 \beta + 4.955$$

Figure 8:
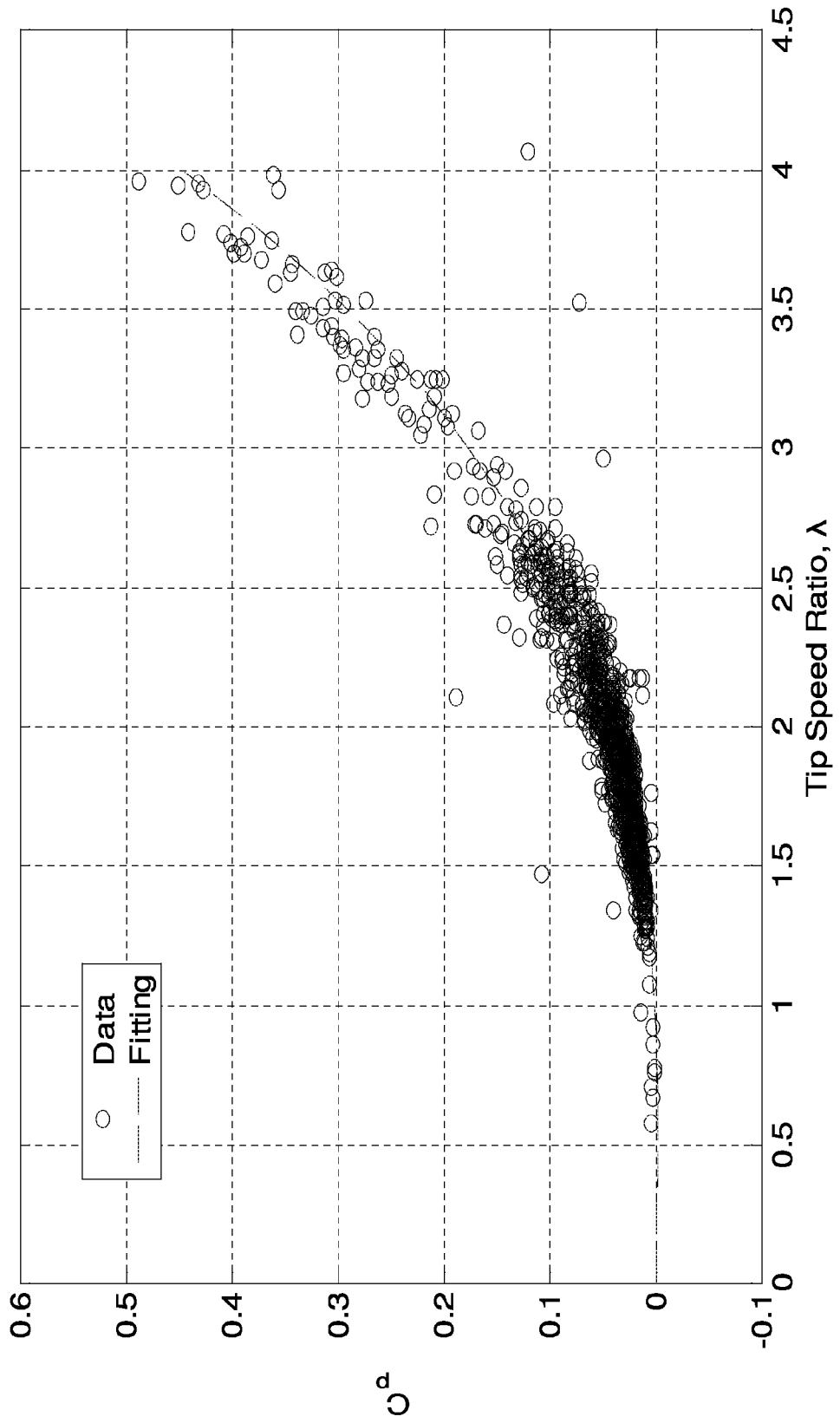
FIG. 8 is the surface chart of actual power coefficient versus actual tip speed ratio for this invention.
Figure 9:
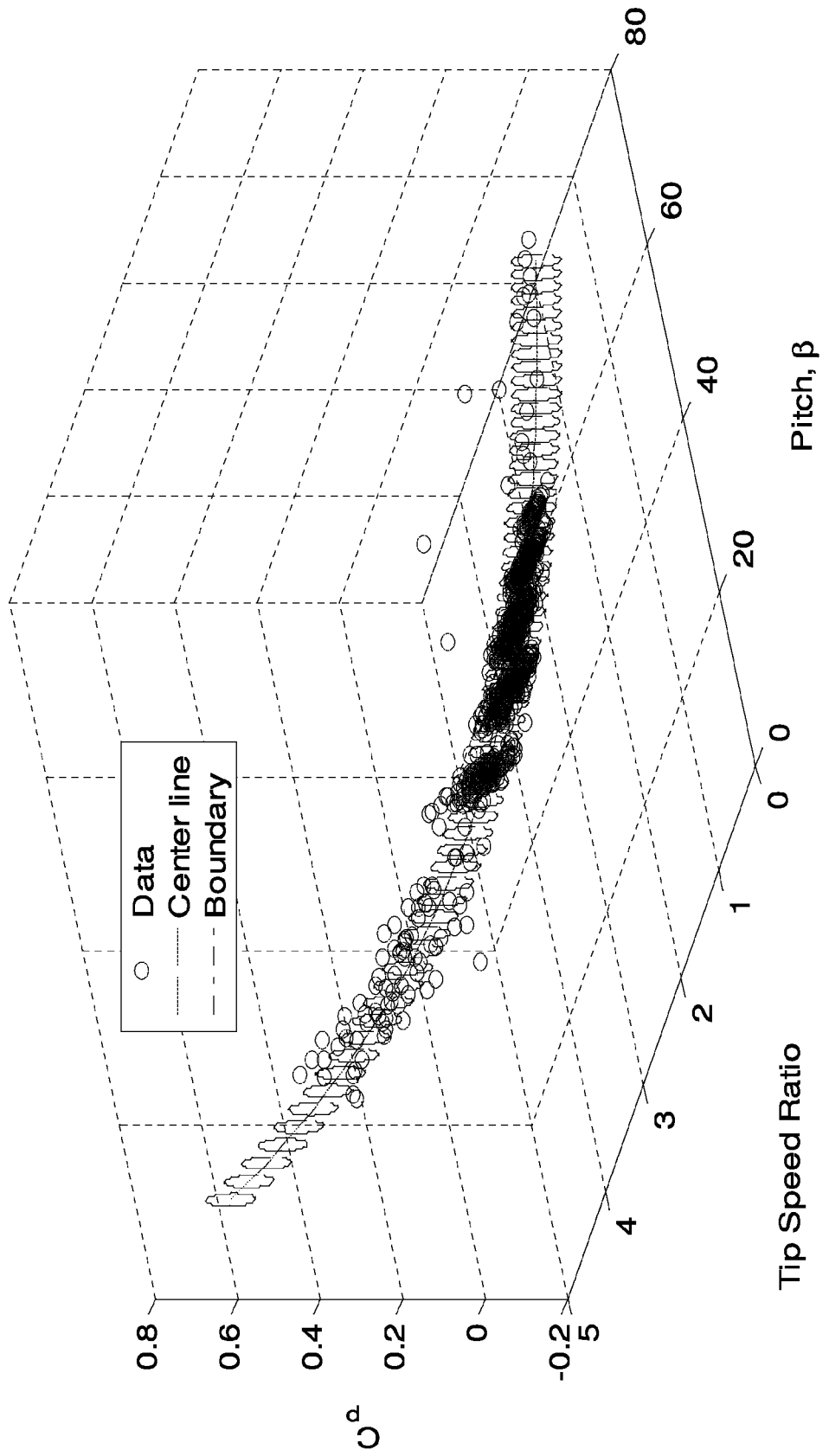
FIG. 9 is the surface chart of actual power coefficient versus actual tip speed ratio versus actual vane pitch angle value for this invention.
Figure 10:
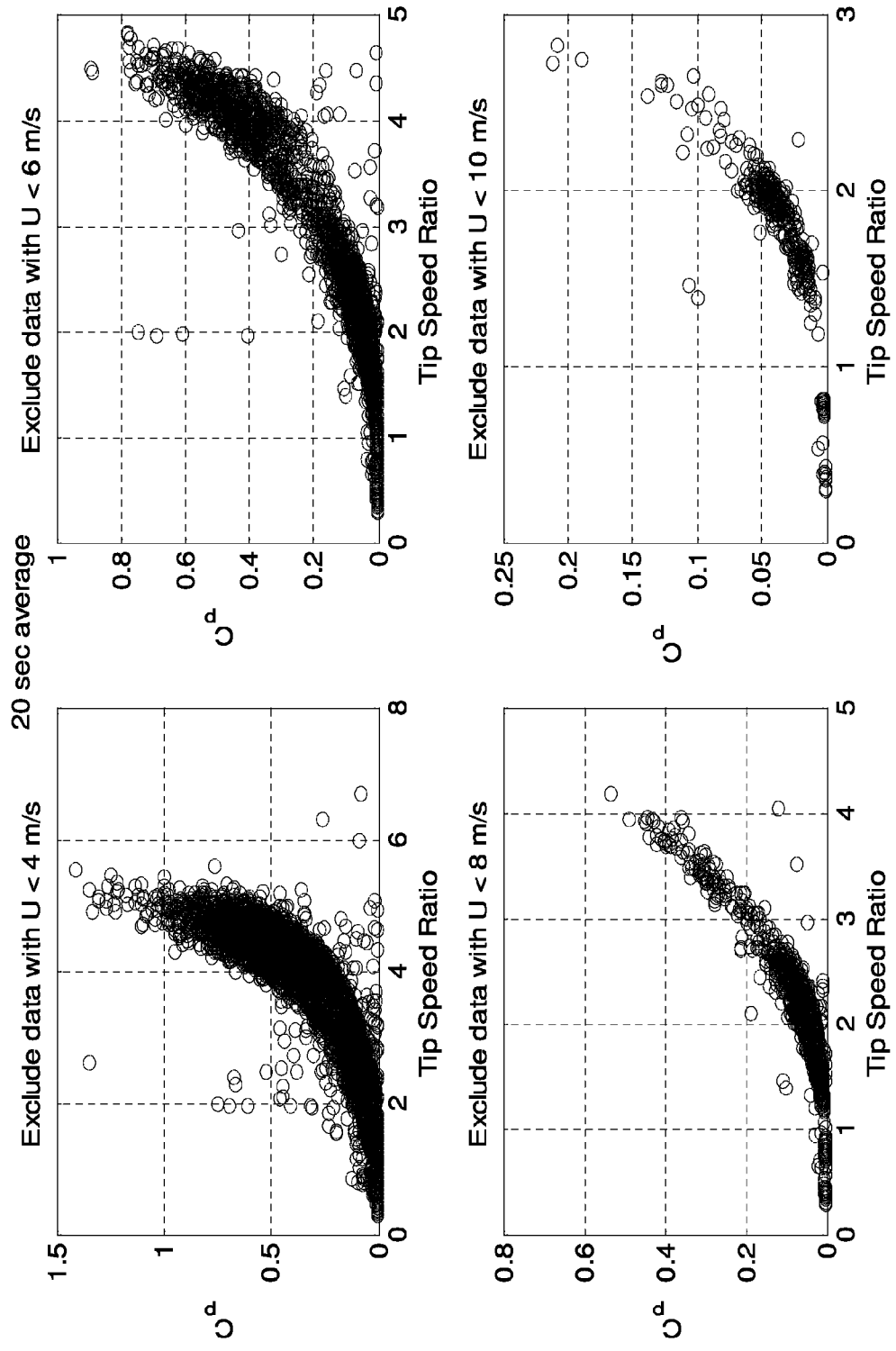
FIG. 10 is the comparison chart of actual power coefficient versus actual tip speed ratio for this invention under wind speed of 4~10 m/s.

Substitute the obtained vane pitch angle value ($\beta_m$) into it, we can then obtain a calculated tip speed ratio ($\lambda c$), and the curve equation in the FIG. 8 can correspond to correlation equation between the following calculated tip speed ratio ($\lambda c$) and a calculated power coefficient ($C_{p-c}$):

$$C_p = 0.0079 \lambda^3 - 0.0028 \lambda^2 - 0.0042 \lambda$$

a calculated power coefficient ($C_{p-c}$) can then be obtained; meanwhile, through the above correlation, we can draw a actual power coefficient ($C_p$) versus actual tip speed ratio ($\lambda$) versus actual vane pitch angle value ($\beta$) curve, as shown in FIG. 9, the following judgment equation can be obtained through approximation:

$$\sqrt{(\lambda_m - \lambda_c)^2 + (C_{p-m} - C_{p-c})^2} \leq 0.06$$

Wherein 0.06 is its boundary; however, the above equation has its utilization limitation, and it is not applicable when wind speed <8 m/s, and $\psi > 16°$, FIG. 10 is the experimental data of actual power coefficient ($C_p$)—actual tip speed ratio (λ) with respective filtering of wind speed 4~10 m/s, it can be considered from the figure that in the wind speed region of 4 m/s to 8 m/s, due to the influence of transient inertia, $C_p$ mean value will usually exceeds 0.59 (Betz limit), hence, the above judgment equation is only applicable to wind speed≥8 m/s; when the range of the judgment equation can be satisfied, the judgment result can be considered as affirmative "Y", then go to S 18 step "measured power value ($P_m$) is normal; measured vane pitch angle value ($β_m$) is normal; measured wind speed value ($U_m$) is normal"; however, if the value of the above judgment equation exceeds the scope (0.06), then the judgment result is considered as negative "N", and if any fault occurs, then S 19 judgment step "if the measured vane pitch angle value ($β_m$) equal to actual vane pitch angle value (β)" will be executed again; due to the hardware limitation of the motor itself, pitch angle can only rotates in the range 0° (pitch up) to 80° (pitch down); hence, when pitch is rotated to the upper limit (80°), since the gear gap will cause error of 1° to 2°, at this moment, reasonable pitch angle display should be 78°~80°, hence, through pitch reset mechanism, whether the pitch angle sensor can work normally or can't be easily judged. If the judgment result is negative "N", then go to S 20 step "measured vane pitch angle value ($β_m$) is fault", however, if the judgment result is affirmative "Y", then go to S 21 step "measured wind speed value ($U_m$) is fault" to complete the process of judgment method of all the fault detections.

To sum up the above mentioned results, the fault detection device and its means of judgment of wind power generator of this invention indeed can reach the integration of multiple detection data for general judgment and for the generation of the most correct and objective fault detection method, however, the above descriptions is only the preferred embodiment of the invention, any change, modification, variation or equivalent replacement according to this invention should all fall within what is claimed of this invention.

What is claimed is:

1. A method of fault detection using a plurality of detectors through entering values measured by the detectors into an apparatus configured to perform fault detection steps for a wind power generator, comprising the steps:
   step a: using a plurality of detectors to acquire measured values from the wind power generator and entering into the apparatus measured values including vane rotational speed measured by a second detector comprising a vane rotation detector, three phase mean voltage and power measured by a third detector comprising a power detector, vane pitch angle measured by a first detector comprising an encoder, and wind speed measured by a fourth detector comprising a wind speed detector;
   step b: determining if the measured vane rotational speed value by the second detector is equal to the actual vane rotational speed value, and the measured three phase mean voltage value by the third detector is equal to actual three phase mean voltage value, if the result is negative, the process goes to step c, if the result is affirmative, the process goes to step d;
   step c: the measured vane rotational speed value is determined to be faulty and the measured three phase mean voltage value is determined to be faulty and the fault detection process is terminated for fault correction;
   step d: determining if the measured power value by the third detector is equal to actual power value by checking if a relative error is less than 5% of actual power value and:
   if it is, determining that the measured power value is equal to actual power value and proceeding to step f;
   or, if it is not, proceeding to step e;
   step e: determining the measured power value error, if the relative error is equal or more than 5%, the result is to be determined faulty, and the process is terminated for fault correction;
   step f: determining if the measured vane rotational speed value is normal and if the measured three phase mean voltage value is normal;
   step g: determining if actual power coefficient ($C_p$) vs. actual tip speed ratio (λ) vs. actual vane pitch angle value (β) is satisfied with equations below, and if the result is negative, it goes to step i; if the result is affirmative, it goes to step h;
   wherein the measured vane pitch angle value ($β_m$) is substituted into the equation below to
   obtain a calculated tip speed ratio ($λ_c$), $λ=0.000435 β^2 − 0.09587 β + 4.955$, and
   wherein a calculated power coefficient ($C_{p-c}$) is obtained by equation $C_p = 0.00792 λ^3 − 0.002822 λ^2 − 0.0042λ$; and wherein $\sqrt{(λ_m−λ_c)^2+(C_{p-m}−C_{p-c})^2} \leq 0.06$;
   wherein λ is actual tip speed ratio, $λ_c$ is calculated tip speed ratio, $λ_m$ is measured tip speed ratio, $C_p$ is an actual power coefficient, $C_{p-c}$ is a calculated power coefficient, and $C_{p-m}$ is a measured power coefficient;
   step h: determining if the measured power value, the measured vane pitch angle value, and the measured wind speed value are normal and the fault detection process is completed without any fault being detected;
   step i: determining if the measured vane pitch angle value ($β_m$) by the first detector is equal to actual vane pitch angle value (β), if the result is negative, it goes to step j, and it goes to step k otherwise;
   step j: it is confirmed that the measured vane pitch angle value ($β_m$) is determined to be faulty, and the fault detection process is terminated for fault correction;
   step k: it is confirmed that the measured wind speed value is determined to be faulty, and the fault detection process is terminated for fault correction.

2. The method of fault detection of claim 1, wherein the step b uses the following equation $$V_{ac}=6.0913\ Ω\text{rotor} \qquad [u1]$$

to obtain a calculated three phase mean voltage value (Vac-c), and if an error value between the measured three phase mean voltage value ($V_{ac-m}$) and the calculated three phase mean voltage value ($V_{ac-c}$) is less than 30 volts, then the fault detection result is considered affirmative, the measured vane rotational speed value ($Ω_{rotor-m}$) is determined to be equal to actual vane rotational speed value ($Ω_{rotor}$) and the measured three phase mean voltage value ($V_{ac-m}$) is determined to be equal to actual three phase mean voltage value ($V_{ac}$).

* * * * *